United States Patent Office 3,531,733
Patented Sept. 29, 1970

3,531,733

LINEAR AMPLIFIER WITH AC GAIN TEMPERATURE COMPENSATION AND DC LEVELSHIFTING

George W. Haines, Jr., Williamstown, Mass., assignor to Sprague Electric Company, North Adams, Mass., a corporation of Massachusetts Filed Mar. 4, 1968, Ser. No. 710,063
Int. Cl. H03f 1/32, 3/68
U.S. Cl. 330—30 9 Claims

ABSTRACT OF THE DISCLOSURE

A linear amplifier having direct-coupled differential transistor stages and characterized by a stage voltage gain independent of a variation in ambient temperature, low D.C. offset voltages achieved without loss of bandwidth or efficiency, and rejection of common mode signal components. Each amplifier stage is biased by a temperature compensating network which produces a bias current varying with temperature and having the effect of compensating for changes in temperature-sensitive gain element parameters. An undesirable, cumulative D.C. bias level between direct-coupled amplifier stages is reduced by a levelshift network which employs capacitive feedback to compensate for the bandwidth-inhibiting effects of such a network. A common mode rejection is achieved by causing the D.C. shifting in the levelshift network to increase in response to increases of the common mode voltage.

BACKGROUND OF THE INVENTION

This invention relates to linear amplifiers and, in particular, to such amplifiers having integrated direct-coupled differential NPN transistor stages.

The use of linear integrated circuits has, until recently, been retarded by certain technical difficulties. It was thought that large area coupling capacitors, impractical for monolithic technology, would be needed but it subsequently proved feasible to use D.C. coupled circuits dispensing with the need for a large area coupling capacitor. The D.C. coupled differential circuit was adopted for almost all linear circuits because of the ease with which the closely matched NPN transistor pairs could be mass-produced by monolithic techniques.

However, certain limitations exist in the differential stages being used at present. In the absence of capacitive coupling between stages, the base of each stage is placed at the D.C. potential of the collector of the previous stage. To maintain the proper bias, each stage must be biased in its own linear region. This results in a larger D.C. bias level in each succeeding stage and, as the power supply value is approached, reduces the output swing causing a distorted output signal. It is, therefore, desirable to shift (i.e. decrease) the D.C. bias level following the stage producing the required gain.

One method of accomplishing this is to connect transistors of opposite construction to the output of the preceding stage. While this is the preferred method for discrete components, integrated microcircuit fabrication, high-quality complimentary transistors are extremely difficult to produce in the same circuit. Hence a network using transistors of the same type (here NPN) is highly desirable.

Such a circuit has been proposed by R. J. Widlar (Proceedings of National Electronics Conference, 1964, volume 20, pp. 169–173). The stray capacitance of this circuit however, produces an undesirable upper bandwidth limitation which can only be corrected by increasing the power consumed in the network and hence impairing its efficiency.

The use of differential stages also raises the problem of undesirable common mode components in the input signal to the stage. The levelshift network described above also includes means of achieving high common mode rejection.

Another problem is that, unlike digital circuits, after a linear circuit is constructed, component values cannot be adjusted to optimize performance. This necessitates a very accurate design analysis and, in practice, the theoretical design characteristics (input, output and transfer admittances or impedances), have been difficult to obtain due to the nature of the active elements. One of the limitations have been that the gain element parameters of the active device (the matched transistor pair of the differential stage) vary with ambient temperature, resulting in undesirable variations in output. One of the methods employed to solve this problem is to introduce temperature-dependent load or source embedding networks in the circuit. However, it then becomes necessary to employ an appreciable source resistance for simultaneous realization of time constant and gain level desensitivity. This series resistance severely reduces the available gain bandwidth that can be achieved per stage.

Another method is to vary the emitter bias current of the matched transistor pair. Such a method has been proposed by A. J. Overbeck (in an article entitled "Tunable Resonant Circuits," 1965, International Solid State Circuits Conference Digest). The limitation of this method is that a constant gain is realized only over the upper portions of the ambient temperature range (0° C. to 100° C.) and under conditions of low input impedance to the stage and fixed bias voltage for the current source.

SUMMARY OF THE INVENTION

The differential amplifier described in this application includes several features which represent improvements over the existing art. A design calling for a constant output D.C. voltage and A.C. voltage gain, independent of ambient temperature variations, is achieved by connecting current biasing means to a differential stage, said means causing current variations with temperature resulting in holding constant those gain parameters within the stage which ordinarily vary with temperature. A constant gain level over the entire ambient temperature range (−50° C. to 100° C.) is achieved while permitting the flexibility of operating with any values of input impedance or bias voltage. The problem of reducing undesirable cumulative D.C. levels without sacrificing bandwith or efficiency is solved by connecting D.C. levelshift means to the output of a differential stage, said means containing capacitive broadbanding means. The said levelshift means also incorporates means for rejecting the undesirable A.C. common mode voltages which may be present in the output differential signals.

The above network and means are especially suited for linear amplifiers of monolithic fabrication because of excellent component ratio control available but their application is not so limited. The bias current programming can be used with differential amplifiers having discrete active elements.

BRIEF DESCRIPTION OF THE DRAWINGS

A further understanding of the invention can be achieved from a study of the following description and drawing wherein.

DESCRIPTION OF THE INVENTION

Figure 1:
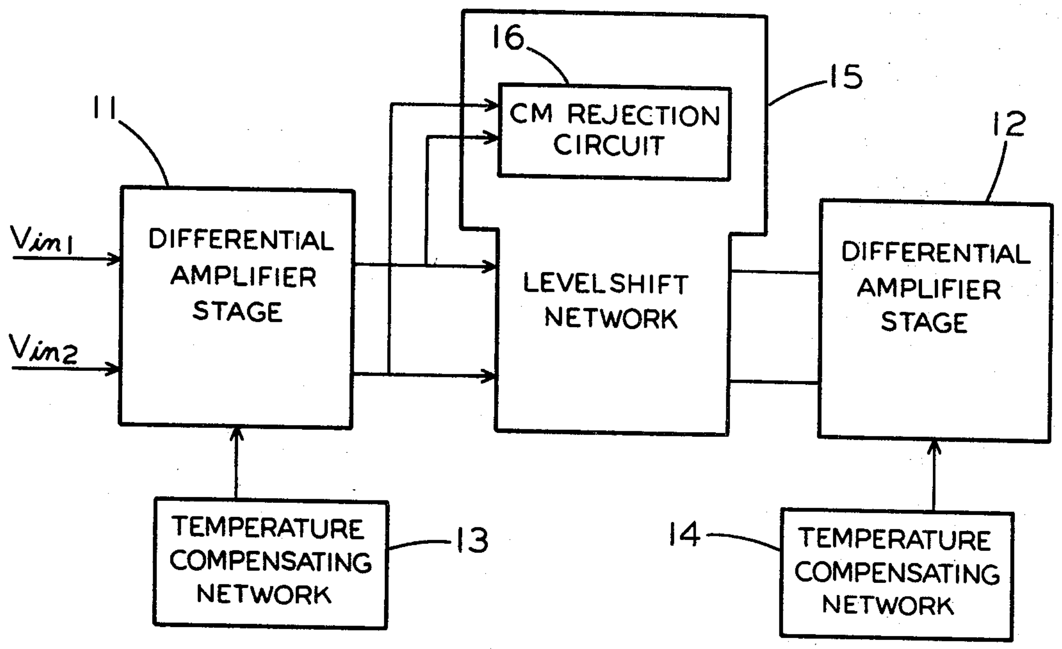
FIG. 1 is a functional block diagram of two differential stages showing the interconnection of the temperature compensating network and the levelshift network.

FIG. 1 shows, in block diagram form, two differential stages 11 and 12 of a cascaded linear amplifier. Temperature compensating networks 13 and 14 desensitize the voltage gains of stages 11 and 12 to the effects of ambient temperature variations. It is assumed, as is often the case with a multi-stage amplifier, that the cumulative effect of the stages preceding and including stage 11 has resulted in an excessive D.C. bias level which it is desired to reduce following stage 11. This reduction, or shifting, is to be accomplished by levelshift network 15. Stage 11 produces two output differential signals which contain common mode components it is desired to reject. The rejection occurs in CM rejection circuit 16. The inputs to stage 12 will then consist of the differential signals at reduced D.C. bias levels.

Although FIG. 1 shows only two stages of the amplifier, many more stages may be used to achieve the desired gain. The above networks and circuits can be introduced where design analysis indicates they will be needed.

Figure 2:
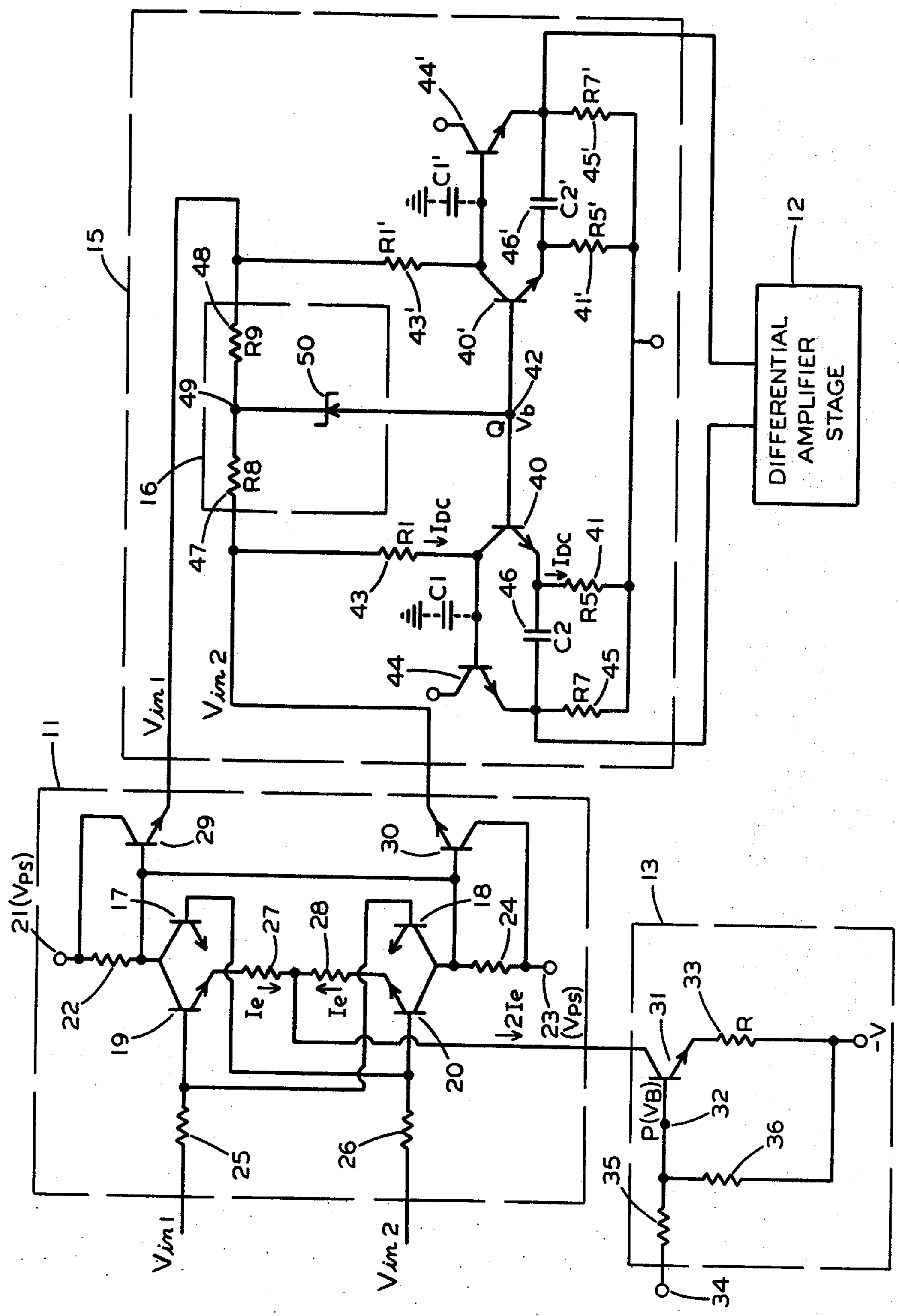
FIG. 2 shows, in detail, the circuits comprising the blocks of FIG. 1.

FIG. 2 shows the circuits which comprise the blocks shown in FIG. 1. The function of the temperature compensating network 13 for stage 11 will be described first. (Network 14 functions in an identical manner and therefore will not be described.)

The differential stage 11 employs transistors 17 and 18 to form a capacitive bridge network with the collector-to-base depletion layer capictance $C_c$ of the active devices, transistors 19 and 20 (see co-pending application Ser. No. 551,341, filed May 19, 1966 for description of these transistor pairs). The collectors of transistors 17 and 19 are biased through power supply 21 across resistor 22. The collectors of transistors 18 and 20 are biased through power supply 23 across resistor 24. Series input resistors 25 and 26 enable feedback current-summing at the bases of transistors 19 and 20 when the stage is driven from a voltage source. Emitter resistors 27 and 28 assure that the pole at the input of the differential stage will be non-dominant. The outputs are supplied to the next stage through emitter followers 29 and 30.

The stage voltage gain for stage 11 is:

$$G_v=\frac{\beta R_L}{R_s+r_b'+\beta(R_e+r_e)} \quad (1)$$

where $\beta$ is the transistor short circuit gain, $R_s$ is the external source resistance, $R_L$ is the load impedance, $r_b'$ is the small signal base-spreading resistance and $r_e$ is the small signal internal transistor base emitter diode resistance. The local feedback produced by resistors 27 and 28 is not sufficient to adequately decrease the effects on stage gain due to the transistor $r_e$ and $\beta$ variations with temperature. (At temperatures of 0° C. to 100° C., $r_e$ is the most significant parameter variation but at temperatures of 0° C. to −50° C., $\beta$ assumes that role.) The effects of the $r_e$ variations will first be discussed followed by a like treatment for $\beta$.

The variations in $r_e$ with temperature is given by the equation:

$$r_e=\frac{kT}{qI_e} \quad 2))$$

where $k$ is Boltzman's constant, T is the junction temperature in degrees Kelvin, $q$ is the charge on an electron and $I_e$ is the D.C. emitter bias current of each transmitter pair.

Examining Equation (1), the value of $R_e$ can be chosen so that:

$$R_s+r_b'\ll\beta(R_e+r_e) \quad (3)$$

and the amplifier gain can then be written:

$$G_v=\frac{\beta R_L}{\beta(R_e+r_e)}=\frac{R_L}{R_e+r_e} \quad (4)$$

From Equation 4, it is seen that the gain varies inversely and linearly with changes in $r_e$ and defines part of the problem to be solved; i.e. to maintain the value of $r_e$ constant over the upper temperature range. An examination of Equation 2 shows that this can be accomplished if $I_e$ is made to vary linearly with temperature over this range.

At temperatures of 0° C. to −50° C., the value of $\beta$ falls to a value sufficiently low so that Equation 3 is no longer satisfied. Since the effects on gain due to the change in $\beta$ and $r_e$ are opposite, a constant $r_e$ at low temperatures will result in $\beta$ becoming the most significant factor and the falling off of $\beta$ results in an increased gain variation. The problem in this lower temperature range then is to produce a non-linear bias current variation with temperature resulting in a smaller $r_e$ (hence large $\beta$).

Figure 3:
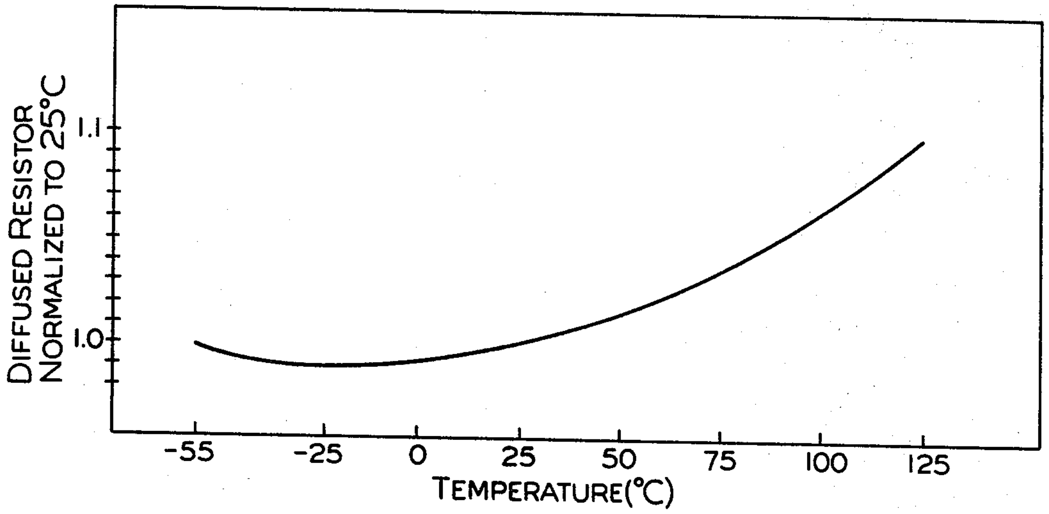
FIG. 3 is a plot showing the effects of a diffused resistor normalized to 25° C. vs. temperature.

These problems are resolved in temperature compensating network 13 of FIG. 2. Referring to FIG. 2, transistor 31 serves as a D.C. current source to bias stage 11. The bias for each transistor pair is given by the expression:

$$I_e=\frac{V_B}{2R}$$

where $V_B$ is the voltage at point 32 (P) and R is resistor 33. The transistor is biased from a D.C. voltage source 34 across a voltage divider consisting of resistors 35 and 36. In the present embodiment, resistor 35 is a near zero TC metal film resistor and resistor 36 is fabricated as a base-diffused resistor (135 ohm/sq.). Of particular importance is the fact that the temperature coefficient of resistor 36 is linear throughout most of the temperature range but changes sign at ≅ −25° C. FIG. 3 shows a plot of the resistor normalized at 25° C. vs. temperature. Any other resistor pair could be used provided they have different temperature coefficients and one of the resistors has the requisite non-linearity in the subzero region.

Figure 4:
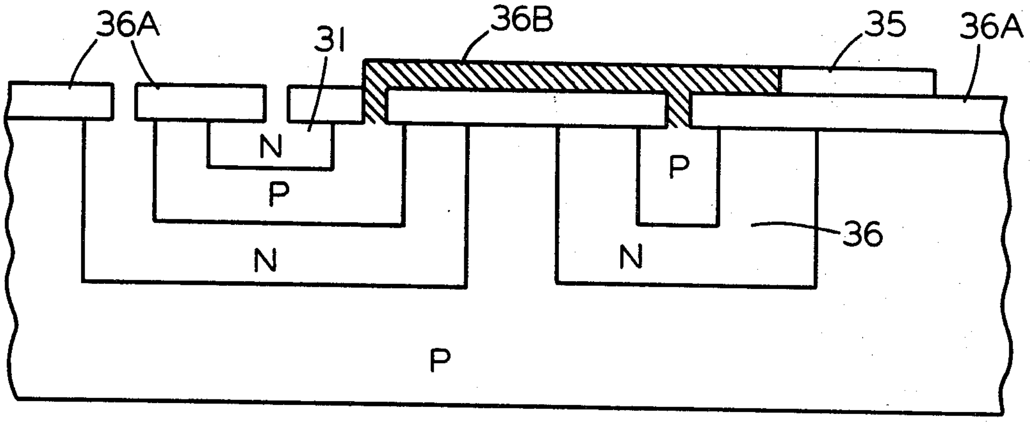
FIG. 4 is a cross-sectional structural view of the temperature compensating elements.

FIG. 4 shows, in a cross-sectional view, the portion of a unitary semi-conductor material which includes transistor 31 and resistors 35 and 36. Transistor 31 and resistor 36 are formed by diffusing successive layers of opposite conductivity types into a P-type structure, and covering the surface with silicon oxide coating 36A. Film resistor 35, which is composed of nichrome in this embodiment, is disposed atop the oxide layer. Selective etching is employed to expose contact areas fofr the diffused resistor and transistor base. The transistor and resistors are then interconnected using an aluminum deposition 36B.

Figure 5:
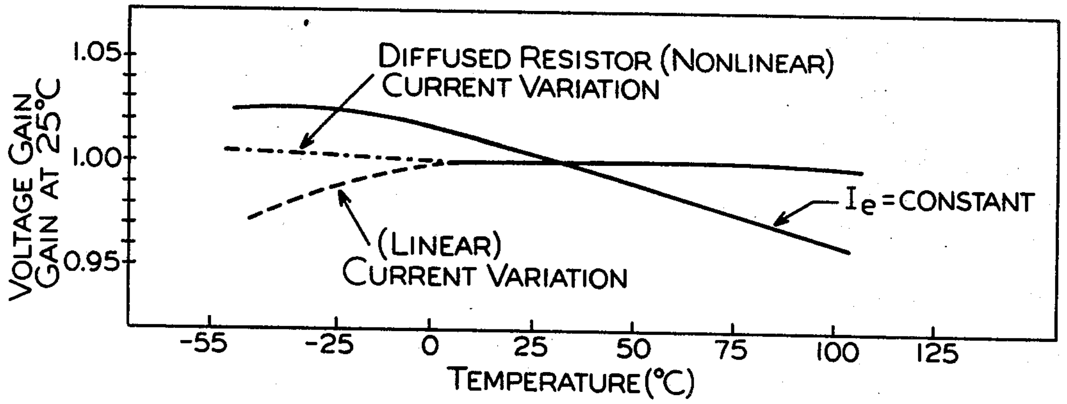
FIG. 5 is a plot showing the effects of temperature on stage gain both with and without the temperature compensating network.

As the temperature rises or falls in the upper temperature regions, the value of resistor 36 changes in like manner. This linear change is reflected in a proportional change in $V_B$ and, ultimately, in bias current $I_e$. Thus, over the upper ambient region, a linear change in $I_e$ is achieved which holds the value of $r_e$ (hence gain) constant. Under 0° C. however, and as shown in FIG. 3, the change in resistor 36 value is no longer linear and in fact becomes non-linear at ≅ 25° C. This causes the non-linear change in $I_e$ designed to offset the falling value of $\beta$. A constant gain is achieved using a voltage source of +6 v., and resistors 35, 36 and 33 equal to 9.7 K., 2.8 K., and 1 K. ohms respectively. FIG. 5 shows the results in maintaining a constant gain achieved using network 13 compared to a program producing solely linear bias current variation through the ambient temperature range and also compared to the situation where $I_e$ remains constant (i.e. no form of programming). It is to be noted that, using the temperature compensating network, the voltage gain is maintained near unity throughout the temperature range.

Figure 6:
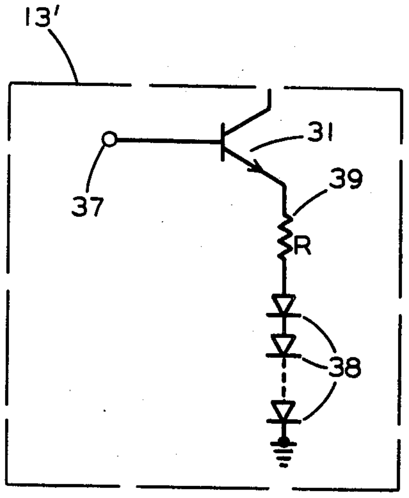
FIG. 6 shows a linear bias current programming circuit.

An alternate bias current programming circuit that can be used satisfactorily in a temperature environment consistently over 0° C. is shown in FIG. 6. Again, transistor 31 serves as a D.C. current source to bias stage 11. The bias current for each of the transistor pair is $$I_e=\frac{V_c-(n+1)V_{be}}{2R} \quad (5)$$

where $V_c$ is the bias voltage from source 37 for transistor 31, $n$ is the number of diodes 38 having internal base-emitter diode resistances equal to that of transistor 31, $V_{be}$ is the voltage drop across each base-emitter diode resistance, and resistor R (39) is the emitter resistor for transistor 31.

Of prime consideration is the fact that $V_{be}$ varies linearly with temperature and, hence, from Equation 5, causes a similar variation in $I_e$. By Equations 2 and 5 a variation in $I_e$ which will hold the value of $r_e$ constant during temperature changes can then be obtained by an appropriate choice of bias voltage $V_c$, resistor R and number of diodes. For example, $\Delta r_e$ will be zero for an R or 670 ohms, an $I_e$ of 1 ma., $V_c$ of +6 volts and 2 diodes in the network. It is to be noted that the introduction of additional base-emitter voltage drops to the circuit through the use of diodes 39 adds flexibility to the current by permitting larger bias current variations under varying input impedance situations.

Referring again to FIG. 2 the double-ended outputs from stage 11 are applied to levelshift network 15 and CM rejection circuit 16. The inputs can be represented by the following equations:

$$V_{in_1}=V_{in_1cm}+V1+VDC \quad (6)$$

$$V_{in_2}=V_{in_2cm}-V1+VDC \quad (7)$$

where $V_{in_1cm}$ and $V_{in_2cm}$ are the A.C. common mode components of the input signal, (assuming they are present) equal in amplitude and phase; the V1 terms the the differential signals and the VDC terms are the D.C. bias levels established in stage 11. It is desirable to manipulate this input to achieve the following results at the output of the levelshift network: a rejection of the common mode signals, a unity transfer of the differential signals and a reduction in the D.C. bias level. The last two objectives are discussed first.

Referring to FIGS. 1 and 2, the inputs are applied to identical sides of the levelshift network 15. Since each half of the network has the same function and has identical elements, only one side will be described. Transistor 40, biased by resistor 41 (R5) acts as a D.C. current source to bias emitter follower 30. Bias current $I_{DC}$ is established by the value of $V_b$ at point 42 (Q) and resistor R5. The basic D.C. level shifting drop appears across resistor 43 (R1) and is expressed as $\Delta V_{DC}=I_{DC}R1$. Another emitter follower 44 is used to give low output impedance and the output signal appears across resistor 45 (R7). Capacitor C1 (shown dotted) is the combined capacitance, in picofarads, of the collector-isolation capacitance and collector-base capacitance of transistor 40 and the collector-base capacitance of transistor 44. Capacitor C1 is in shunt with the output transistor 44 and, at high frequencies, $X_{c1}$ becomes small enough so that part of the output signal is lost to ground through Cl. This loss would result in a reduced output were it not for the positive current feedback through capacitor 46 (C2). This feedback converts transistor 40 from a D.C. bias current source into a current source which depends in part on the output voltage.

The output across R7, neglecting the small base-emitter D.C. voltage drops across transistors 40 and 44, and for the usual case of a high impedance load ($Z_L \gg R1$), is given by the expression $$V_{out_1}=V_{in_1cm}+V1(+VDC-I_{DC}R1) \quad (8)$$

showing that the D.C. level of transition is made without a loss of A.C. signal level.

The importance of capacitor C2 can best be appreciated by examining the results if it were eliminated. As described above, the output would be reduced at high frequencies because of the parsitic capacitance C1. Since the output gain level must be maintained, the only practical alternative is to reduce the RC time constant of the network (R1C1). Since C1 cannot be changed, R1 must be given a smaller value but $I_{DC}$ must then increase to maintain the required d.c. voltage drop across R1. This current increase results in an increased network power dissipation and, since no signal gain is achieved, the network efficiency is lowered. It is, therefore, seen that the network, without C2, either consumes a disproportionate amount of power compared to the remaining circuitry or limits the bandwidth of the overall amplifier design.

An optimum value of 0.6 C1 has been determined for capacitor C2 by constructing a root locus plot showing the transfer poles of the network as C2 is varied. This value greatly increases the bandwidth of the levelshift network without increasing the power dissipated in the circuit. For R1 and R5=1KΩ, R7=3KΩ, $V_b$=6 v., $V_{ps}$=12 v., a D.C. voltage shift of 3 v., a C1 of 5 pf. and a C2 of 3.0 pf., the network is broadbanded to consist of a two-time constant response with real transfer function poles at 100 mHz. (bandwidth 60 mHz.).

The circuit discussed thus far results in a unity transfer of common mode input signals to the output. As mentioned previously, it is desired to reject such signals. This is accomplished in the CM rejection circuit 16. The inputs, Equations 6 and 7, are applied across resistors 47 (R8) and 48 (R9) having the same value. The differential signals, equal and opposite to each other, will cancel out and the voltage at point 49 will equal $V_{in\ cm}$. Zener diode 50 provides a steady reference voltage drop $V_{REF}$ and the bias voltage to transistor 40 (or 40') is $$V_b=V_{in\ cm.}-V_{REF} \quad (9)$$

From the preceding description, $$I_{DC}=\frac{V_b}{R5}$$

so that the value of $I_{DC}$ is now dependent on the value of $V_{in\ cm.}$.

As the input common mode signal increases, it will cause $V_b$ to increase which, in turn, results in a greater $I_{DC}$ and a greater voltage drop across R1. If R5 is made equal to R1, the increased voltage drop across R1 will equal the common mode voltage and the output voltage will consist of the differential signal and the D.C. term.

Figure 7:
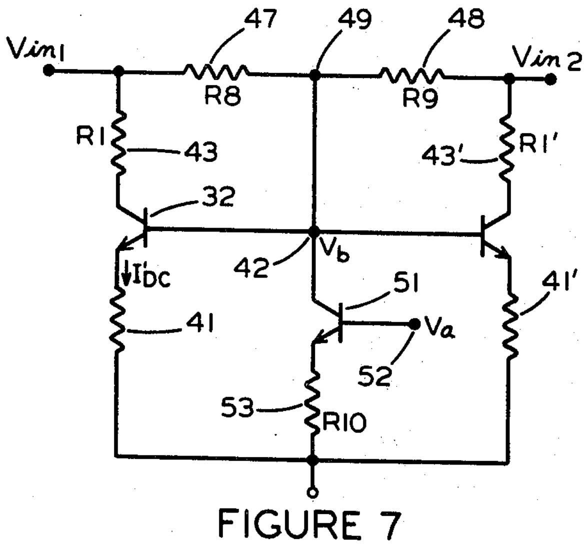
FIG. 7 is an alternate common mode rejection circuit.

Alternatively, a current source can be used to obtain the input related bias voltage for transistors 40 and 40'. FIG. 7 shows current source transistor 51 connected into the network. The transistor produces a current $I'_{DC}$ dependent on the value of bias voltage 52 ($V_a$) and resistor 53 (R10). The voltage at point 49 is now the $V_b$ term and is expressed by $$V_b=V_{in\ cm.}-\frac{I'_{DC}R_{10}}{2}$$

The same effect is then produced when a common mode input is present: $V_b$ increases resulting in an increased voltage drop across R1 and, if R1=R5, the common mode signal is rejected.

While a particular embodiment of the invention has been shown and described, it is not intended that the invention be limited to such disclosure but that changes and modifications obvious to those skilled in the art and can be made and incorporated within the scope of the claim. For example, other circuits may be employed to accomplish the common mode rejection the basic requirement being that $V_b$ must take the form of $V_{in\ cm.} - V_{REF}$. Also, in the circuit shown in FIG. 6, other elements may be substituted for the diodes provided the linear voltage change is achieved.

What is claimed is:

1. A linear amplifier comprising a plurality of direct-coupled NPN differential transistor amplifier stages, at least one of said differential stages having a pair of active transistors, said stage biased by a temperature-compensating network producing a bias current varying with temperature and compensating for changes in temperature-sensitive gain element parameters, said network having a transistor biased from a D.C. voltage source across a voltage-divider of a series-connected pair of resistors, said transistor providing a D.C. current source to the emitters of said transistors of said stage, one of said resistors having a substantially linear temperature coefficient which change sign at about −25° C., the two outputs of said one stage feeding a levelshift network having capacitive feedback compensating for the bandwidth inhibiting of the cummulative D.C. bias level, said levelshift network having common mode signal component rejection means including center-tapped resistors connected to the two outputs of said stage causing D.C. shifting to increase in response to increase in common mode voltage.

2. An amplifier according to claim 1 wherein said temperature-compensating network includes an additional resistor connected to the emitter leg of said current source transistor, and a negative voltage supply commonly connected to said additional resistor and resistor pair whereby a selected D.C. bias current is provided for said stage, said bias current varying linearly with temperature over the temperature range of 0° C. to 100° C. and generally non-linearly with temperature over the temperature range of 0° to −50° C. in response to bias voltage variation across said resistor pair, the total effect being to nullify the changes in those amplifier stage gain parameters which would vary with these temperatures, thereby holding the amplifier A.C. gain constant.

3. An amplifier according to claim 2 wherein said means for causing a bias current variation in said stage is partially embodied in at least a portion of a block of a unitary semiconductor material and includes a current source transistor having a first and third layer of one conductivity type alternating with second and fourth layers of an opposite conductivity type; a base diffused resistor having a first and third layer of one conductivity type alternating with a second opposite conductivity type, said resistor being the resistor having a temperature coefficient which changes sign at approximately −25° C.; a metal film resistor disposed on the surface of said semiconductor material and having a tempearture coefficient differing from said base diffused resistor; means for interconnecting said metal film and diffused resistor and means for connecting said interconnected resistors to said transistor whereby, when said resistors are used in providing a bias voltage to said transistor, a linear change in bia accompanies temperature changes from −25° C. to 100° C. while a non-linear change in bias accompanies temperature changes from −25° C. to −50° C.

4. An amplifier according to claim 3 wherein said metal film resistor has a near zero temperature coefficient, and said base-diffused resistor has a resistivity of 135 ohms/square, said diffused resistor having the property of a resistance which varies linearly with temperature over the temperature range of 0° C. to +100° C. but which changes its temperature coefficient sign at ≃−25° C. and produces a non-linear resistance change in the sub-zero region.

5. An amplifier according to claim 1 wherein said level-shift network comprises two identical circuits each having a dropping resistor connected in series with a differential output of a preceding stage, a D.C. current source transistor producing values of current through, and voltage drops across, said dropping resistor, said values determined by the value of a D.C. bias input to the base of said transistor and an external emitter resistor, said emitter resistor having the same value as the dropping resistor; an emitter follower transistor connecting the signal across said dropping resistor to an output load element, and a capacitor connected between said load element and current source transistor so as to create a positive current feedback to said transistor and having the effect of maintaining a broadbanded output level by compensating for parasitic capacitances in said emitter follower and current source transistors.

6. An amplifier according to claim 5 wherein said capacitor connected between output load element and current source transistor has a value equal to 0.6 of said parasitic capacitance.

7. An amplifier according to claim 5 wherein said common mode rejection resistors comprise two resistors of equal value connected in series to each other and to the ends of each connected in series with a differential output thereby forming a voltage divider at whose center the differential signals are canceled, and the sum of the common mode voltages are halved; and a Zener diode, having a fixed voltage drop, connected between said voltage divider center and the base of the current source transistor and creating a bias voltage for said transistor whose value is equal to the difference between the halved sum of the common mode voltages and the diode voltage drop whereby any increase in common mode voltage causes an equal increase in the voltage across the dropping resistor, resulting in the elimination of the common mode voltage in the output.

8. An amplifier according to claim 5 wherein said common mode rejection resistors comprise two resistors of equal value connected in series to each other and to the ends of each connected in series with a differential output thereby forming a voltage divider at whose center the differential signals are canceled, and the sum of the common mode voltages are halved; and a second current source transistor having an associated bias voltage supplied to its base and a resistor in its emitter leg, said second transistor connected between said voltage divider center and the base of the first current source transistor whereby a current is caused in said series connected resistors determined by the value of aid bias voltage and emitter resistor.

9. An amplifier according to claim 5 wherein said means for rejecting common mode voltages is a circuit which produces a bias voltage to the base of said current source transistors equal to the difference between the halved sum of the common mode voltages and a fixed reference voltage.

References Cited

UNITED STATES PATENTS

| | | | |
|---|---|---|---|
| 3,119,028 | 1/1964 | Cook | 330—30 X |
| 3,188,576 | 6/1965 | Lewis | 330—40 X |
| 3,290,520 | 12/1966 | Wennik | 330—69 X |
| 3,431,508 | 3/1969 | Soltz et al. | 330—30 X |

ROY LAKE, Primary Examiner

L. J. DAHL, Assistant Examiner

U.S. Cl. X.R.

330—23

UNITED STATES PATENT OFFICE
CERTIFICATE OF CORRECTION

Patent No. 3,531,733 Dated September 29, 1970

Inventor(s) George W. Haines, Jr.

It is certified that error appears in the above-identified patent and that said Letters Patent are hereby corrected as shown below:

Column 1, line 16, change "a variation" to -- variations --
Column 1, line 61, before "integrated" insert -- in --
Column 2, line 13, change "have" to -- has --
Column 2, line 48, change "bandwith" to -- bandwidth --
Column 3, line 37, change "capictance" to -- capacitance --
Column 4, line 43, change "at" to -- to --
Column 4, line 56, change "fofr" to -- for --
Column 5, line 17, change "$V_{bc}$" to -- $V_{be}$ --
Column 5, line 27, change "or" to -- of --
Column 5, line 31, change "current" (first occurrence) to -- circuit --
Column 5, line 44, change "the" (first occurrence) to -- are --
Column 6, line 9, change "parsitic" to -- parasitic --
Column 7, line 19, change "change" to -- changes --
Column 7, line 36, change "0°" to -- 0°C. --
Column 7, line 54, change "tempearture" to -- temperature --
Column 7, line 59, change "bia" to -- bias --
Column 8, line 50, change "aid" to -- said --

SIGNED AND SEALED DEC 8 - 1970

(SEAL)
Attest:

Edward M. Fletcher, Jr.
Attesting Officer

WILLIAM E. SCHUYLER, JR.
Commissioner of Patents

USCOMM-DC 60376-P69
★ U.S. GOVERNMENT PRINTING OFFICE : 1969 O—366-334